US006437380B1

(12) United States Patent
Lim et al.

(10) Patent No.: US 6,437,380 B1
(45) Date of Patent: Aug. 20, 2002

(54) FERROELECTRIC DEVICE WITH BISMUTH TANTALATE CAPPING LAYER AND METHOD OF MAKING SAME

(75) Inventors: Myoungho Lim; Vikram Joshi; Narayan Solayappan; Larry D. McMillan; Carlos A. Paz de Araujo, all of Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 09/819,542

(22) Filed: Mar. 28, 2001

(51) Int. Cl.⁷ .................................................. H01L 29/76
(52) U.S. Cl. ...................... 257/295; 257/296; 257/310; 257/379; 257/532
(58) Field of Search ................................ 257/295, 296, 257/310, 379, 532

(56) References Cited

U.S. PATENT DOCUMENTS

| | | |
|---|---|---|
| 5,434,102 A | 7/1995 | Watanabe et al. |
| 5,468,684 A | 11/1995 | Yoshimori et al. |
| 5,780,886 A | 7/1998 | Yamanobe |
| 5,784,310 A | 7/1998 | Cuchiaro et al. |
| 6,104,049 A | 8/2000 | Solayappan et al. |
| 6,197,102 B1 * | 3/2001 | Sawada et al. ........ 106/287.18 |
| 6,274,388 B1 * | 8/2001 | Aggarwal et al. .......... 257/295 |
| 6,340,621 B1 * | 1/2002 | Anderson et al. .............. 438/3 |

* cited by examiner

Primary Examiner—Eddie Lee
Assistant Examiner—N. Drew Richards
(74) Attorney, Agent, or Firm—Patton Boggs LLP

(57) ABSTRACT

An integrated circuit device includes a thin film of bismuth-containing layered superlattice material having a thickness not exceeding 100 nm, a capping layer thin film of bismuth tantalate, and an electrode. The capping layer has a thickness in a range of from 3 nm to 30 nm and is deposited between the thin film of layered superlattice material and the electrode to increase dielectric breakdown voltage. Preferably the capping layer contains an excess amount of bismuth relative to the stoichiometrically balanced amount represented by the balanced stoichiometric formula $BiTaO_4$. Preferably, the layered superlattice material is ferroelectric SBT or SBTN. Preferably, the integrated circuit device is a nonvolatile ferroelectric memory. Heating treatments for fabrication of the integrated circuit device containing the bismuth tantalate capping layer are conducted at temperatures not exceeding 700° C., preferably in a range of from 650° C. to 700° C.

18 Claims, 5 Drawing Sheets

FERROELECTRIC DEVICE WITH BISMUTH TANTALATE CAPPING LAYER AND METHOD OF MAKING SAME

BACKGROUND OF THE INVENTION

1. Field of the Invention

The present invention pertains to the field of thin films for use in integrated circuits, and particularly ferroelectric thin films. More specifically, a specialized capping layer containing bismuth tantalate increases the dielectric breakdown voltage of bismuth-containing layered superlattice material thin films.

2. Statement of the Problem

A ferroelectric device, such as a capacitor, is useful as a nonvolatile memory when it possesses desired electronic characteristics, such as high residual polarization, good coercive field, high fatigue resistance, low imprint, low leakage current and high breakdown voltage. See, for example, U.S. Pat. No. 5,784,310 issued Jul. 21, 1998 to Cuchiaro et al. It is also possible to make a ferroelectric memory cell consisting of a field effect transistor as described in U.S. Pat. No. 5,780,886 issued Jul. 14, 1998 to Yamanobe et al. Layered superlattice material oxides have been studied for use in integrated circuits. U.S. Pat. No. 5,434,102, issued Jul. 18, 1995 to Watanabe et al., and U.S. Pat. No. 5,468,684, issued Nov. 21, 1995 to Yoshimori et al., describe processes for integrating these materials into practical integrated circuits. Layered superlattice materials exhibit characteristics in ferroelectric memories that are orders of magnitude superiorto those of perovskite compounds, such as PZT and PLZT. As reported in U.S. Pat. No. 5,784,310 issued Jul. 21, 1998 to Cuchiaro et al., layered superlattice materials have relatively very good fatigue and imprint characteristics compared to other types of ferroelectric materials. However, layered superlattice materials typically required processing temperatures in excess of 700° C. in order to achieve proper crystallization and the desired electronic propertied. This is an obstacle to the commercial utilization of layered superlattice materials in integrated circuits because other components of the circuits typically require that the fabrication processing temperatures not exceed 700° C.

It is highly desirable that a ferroelectric memory be dense; that is, that there be a high number of memory cells in a given chip volume. To achieve maximum density, the individual elements of the memory should be as small as possible. This requires that the films of ferroelectric material be as thin as possible. However, generally, it has been found that the processing+parameters, such as annealing temperatures, necessary to produce integrated circuit quality electronic devices also cause films less than about 100 nm to crack or otherwise fail. U.S. Pat. No. 6,104,049, issued Aug. 15, 2000 to Solayappan et al. discloses a ferroelectric memory cell comprising a thin film of layered superlattice material having a thickness of 90 nm or less. The layered superlattice material is crystallized by RTP annealing at 675° C. for 30 seconds followed by a post-anneal in oxygen or nitrogen for one hour at 700° C. The Solayappan et al. patent disclosed a thin film of strontium bismuth tantalate (SBT) having a thickness of 90 nm with a 2Pr-value of 15 $\mu C/cm^2$ and a current density less than $10^{-6}$ A/cm² at an applied voltage of ±5 volts. After $10^{10}$ cycles, fatigue was less than 1.0% and imprint was about 20%.

However, the thin film process of Solayappan et al, while solving the temperature and thickness problems, still left other unresolved problems in trying to make a commercial, dense memory from layered superlattice materials. Specifically, the decrease in thin film thickness caused an undesirable increase in leakage current and an undesirable decrease in dielectric breakdown voltage. When a memory capacitor exhibits high leakage current, its power consumption increases and it is not able to store information over a long period because the charge polarization slowly dissipates as a result of undesired migration of charge carriers. It is currently held in the art that the current density measured in a memory capacitor should not exceed $10^{-6}$ A/cm² in the range of its operating voltages.

As the voltage is increased across the dielectric material of a memory capacitor, a point is ultimately reached beyond which the insulation is no longer capable of sustaining any further rise in voltage and breakdown ensues, causing a short to develop between the electrodes. In ferroelectric and nonferroelectric layered superlattice materials, as well as in other solid metal-oxide dielectrics, the initial breakdown results in the formation of a permanent conductive channel, which cannot support a reapplication of voltage.

A general model of dielectric breakdown assumes widespread injection of electrons from one electrode, impact-ionization by the injected electrons, accumulation of some of the generated positive charges in a few isolated locations, and self-egenerative conduction through one of those locations, leading to thermal runaway. Injection is by a tunneling mechanism with regions of higher current density provided by submicroscopic surface irregularities on the (intended to be plane) emitting electrode. As the thickness of dielectric thin films, including thin films of layered superlattice material, is reduced, breakdown voltage occurs at a lower voltage. It is believed that this relationship may be a function of the relative size of surface irregularities compared to the metal-oxide thin film thickness. The dielectric breakdown voltage of an integrated circuit memory capacitor should be about four times greater than its normal operating voltage.

U.S. patent application Ser. No. 09/229,883, filed Jan. 14, 1999, discloses a capping layer comprising a metal oxide selected from the group consisting of bismuth oxide, bismuth strontate, bismuth tantalate, bismuth niobate and bismuth niobium tantalate. The capping layers taught in the '883 application have a thickness in a range of 3 nm to 30 nm and are disposed on the surface of a thin film of layered superlattice material between the thin film and an electrode. The '883 application disclosed an exemplary capacitor in which a bismuth oxide, $BiO_x$, capping layer having a thickness of about 10 nm was formed on the upper surface of a thin film of the ferroelectric strontium bismuth tantalate (SBT) layered superlattice material having a thickness of about 200 nm. The capacitor having a capping layer had a measured 2Pr-value of about 17 $\mu C/cm^2$ measured at 5 volts, which was an improvement in polarizability of about 30% compared to a capacitor without the bismuth oxide capping layer. It is noteworthy that the SBT thin film fabricated in accordance with the method of the '883 application had a total thickness of 200 nm, which is thicker than currently required to achieve maximum integrated circuit density. Furthermore, the exemplary thin film of the '883 application was annealed by RTP at 725° C., and the capacitorwas given a post-anneal at 800° C, which temperatures exceed the maximum feasible fabrication temperature of 700° C. Finally, although the exemplary capacitor having a $BiO_x$ capping layer exhibited good polarizability, the '883 application did not teach or otherwise disclose the leakage current or the dielectric breakdown voltage of capacitors having a capping layer.

To produce reliable and efficient nonvolatile ferroelectric memories in high-density memory integrated circuits, it would be highly desirable to have a ferroelectric thin film having a polarizability greater than 7 $\mu C/cm^2$, a thickness of about 100 nm or less, low leakage current and high dielectric breakdown voltage, that can be fabricated using a method compatible with other integrated circuit components.

SOLUTION

The present invention advances the art and helps to overcome the aforementioned problems by increasing the dielectric breakdown voltage of a dielectric thin film of bismuth-containing layered superlattice material in integrated circuit devices. In particular, the invention provides improved thin film ferroelectric devices having good polarizability, low leakage current and high dielectric breakdown voltage. Integrated circuit devices in accordance with the invention, in particular, nonvolatile ferroelectric memory cells, contain a thin film of bismuth-containing layered superlattice material having a thickness of about 100 nm or less. A feature of the invention is that the films with low leakage current and high dielectric breakdown are produced by a method having process temperatures not exceeding 700° C. These improvements, especially a relatively high dielectric breakdown voltage, are a result of a bismuth tantalate capping layer disposed on the surface of a thin film of bismuth-containing layered superlattice material between an electrode and the thin film.

A device in accordance with the invention includes a substrate supporting a thin film of bismuth-containing layered superlattice materials. The thin film of layered superlattice material is "capped" on one or both of the top and bottom surfaces by a capping layer comprising bismuth tantalate, that is, bismuth tantalum oxide. Preferably, the capping layer contains an excess of bismuth relative to the stoichiometrically balanced amount. Preferably, the excess amount of bismuth is in a range of from 5% to 15%, and most preferably is 7.5%. An electrode is typically above or below the capping layer, and preferably resides in direct contact with both the electrode and the thin film of bismuth-containing layered superlattice material. Preferably, the capping layer caps the layered superlattice material beneath the top electrode, but if there are two electrodes, such as in a ferroelectric capacitor, the capping layer may cap both the top and bottom of the thin film of layered superlattice material.

A capping layer in accordance with the invention is useful for capping a thin film of either a ferroelectric or a nonferroelectric bismuth-containing layered superlattice material. Preferred ferroelectric bismuth-containing layered superlattice materials are selected from the group consisting of strontium bismuth tantalate, strontium bismuth niobate, and strontium bismuth niobium tantalate.

The capping layer is preferably at least about 3 nm thick, and preferably ranges from 3 nm to 30 nm in thickness, with the most preferred thicknesses ranging from 5 nm to 20 nm to provide adequate defect compensation while being thin enough to avoid significant problems with parasitic capacitance.

The use of a capping layer comprising bismuth tantalate is critical for achieving the desired increase in dielectric breakdown voltage. Numerous other features, objects and advantages of the invention will become apparent from the following description when read in conjunction with the accompanying drawings.

DETAILED DESCRIPTION OF THE PREFERRED EMBODIMENT

Figure 1:
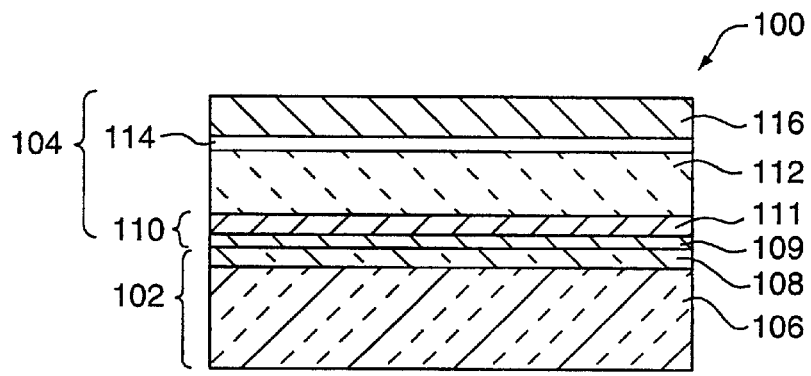
FIG. 1 depicts an integrated circuit device in accordance with the invention with a bismuth tantalate capping layer atop a ferroelectric layer and beneath a top electrode.

FIG. 1 depicts a ferroelectric device 100 including a substrate 102 supporting a ferroelectric capacitor 104. Ferroelectric device 100 is a thin film ferroelectric capacitor having utility in ferroelectric memories and other integrated circuit applications that require ferroelectrics. For example, ferroelectric device 100 is useful as a ferroelectric capacitor or as a gate in a field effect transistor ("FET").

Substrate 102 includes a semiconducting wafer 106, preferably silicon, and an insulating layer 108, preferably silicon dioxide. In the integrated circuit art, the wafer 106 is often referred to as a "substrate". Herein, the term "substrate" is more generally applied to any layer or combination of layers providing support for yet another layer. For example, the substrate 102 for ferroelectric capacitor 104 is immediately the insulating layer 108, but also can be broadly interpreted to include the wafer 106 and the combination of wafer 106 with insulating layer 108. As is conventional in the art, we shall also refer to the device in various states of completion as a substrate, which is intended to include all of the layers completed up to the point of time in reference.

Terms of orientation, such as "above", "top", "upper", "below", "bottom", and "lower" herein mean relative to the wafer 106 in FIGS. 1–3. That is, if a second element is "above" a first element, it means it is farther from the wafer 106; and if it is "below" another element, then it is closer to the wafer 106 than the other element. The long dimension of wafer 106 defines a plane that is considered to be a "horizontal" plane herein, and directions perpendicular to this plane are considered to be "vertical".

The term "thin film" herein means a thin film of a thickness appropriate to be used in an integrated circuit. Such thin films are less than 1 micron in thickness, and generally are in the range of 2 anometers (nm) to 500 nm. It is important to distinguish this term from the same term, i.e., "thin film", as used in essentially macroscopic arts, such as optics, where "thin film" means a film over 1 micron, and usually from 2 microns to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. It is common in the art to write an unbalanced stoichiometric formula of a metal oxide in which the subscript of the oxygen symbol is not corrected to balance completely the subscript values of the metals.

A capping layer in accordance with the invention comprises bismuth tantalate. Bismuth tantalate is also known in the art as bismuth tantalum oxide. Bismuth tantalate material may be represented by the balanced stoichiometric formula $BiTaO_4$. It is a feature of the invention that a capping layer containing excess bismuth enhances the electronic properties of the thin film of layered superlattice material that it covers. The amount of excess or deficient bismuth in a capping layer or in a precursor solution used for making a capping layer is expressed herein as a percentage of the stoichiometrically balanced amount of bismuth.

The word "precursor" used herein can mean a solution containing one metal organic solute that is mixed with other precursors to form intermediate precursors or final precursors, or it may refer to a final liquid precursor solution, that is, the solution to be applied to a particular surface during fabrication. The precursor as applied to the substrate is usually referred to as the "final precursor", "precursor mixture", or simply "precursor". In any case, the meaning is clear from the context.

A "precursor compound" in this disclosure refers to a metal organic compound containing at least one metal that is included in the desired capping layer or layered superlattice material thin film formed in accordance with the invention. The metal organic precursor compounds disclosed herein are useful because they can be easily dissolved in organic liquid precursor solutions, which can be stored until used. The composition of a precursor solution may be described in two ways. The actual dissolved metal organic precursor compounds (solutes) and solvents and concentrations may be specified; or, for the sake of clarity, the stoichiometric formula representing the composition of the final oxide compound to be formed with the precursor may be specified. Similarly, a precursor compound may be described using its name or stoichiometric formula, or it may simply be identified by the metal atoms it contains.

Metal organic precursor compounds and liquid precursor solutions used in accordance with the invention can be manufactured reliably. Their composition can be easily controlled and varied, if necessary. They can be safely stored for long periods, up to six months. They are relatively nontoxic and nonvolatile, compared with many precursors of the prior art. Thin film layers formed in accordance with the invention have smooth, continuous and uniform surfaces, and they can be reliably fabricated to have thicknesses in the range of from 40 nm to 500 nm, maintaining important structural and electrical characteristics.

It should be understood that the specific processes and electronic devices described herein are exemplary; that is, the invention contemplates that the layers in FIGS. 1 and 2 may be made of many other materials than those mentioned above and described below. There are many other variations of the method of the invention than can be included in a document such at this, and the method and materials may be used in many other electronic devices other than integrated circuit devices 100 and 210; in nonferroelectric capacitors containing a thin film of high-dielectric layered superlattice material.

Ferroelectric capacitor 104 contains a metal bottom electrode 110. The metal bottom electrode structure can be any metal or electrode structure suitable for use in integrated circuits, e.g., aluminum, gold, ruthenium, rhodium, and palladium. Bottom electrode 110 is preferably made of a combination of platinum 111 and titanium 109 where titanium functions as an adhesion metal to prevent peeling of the platinum component away from the oxide layer. Tantalum, iridium and iridium oxide are also useful as adhesion metals. The titanium or other adhesion metal 109 is typically sputtered to a thickness ranging from 10 nm to 20 nm. The platinum 111 preferably ranges from 100 nm to 200 nm thick. The metal layers of bottom electrode 110 are formed by conventional atomic sputtering techniques, such as DC magnetron sputtering or radio frequency sputtering. Iridium oxide, $IrO_2$, as well as other conductive materials having barrier properties, is also useful as electrode material in embodiments in accordance with the invention. For example, in stacked memory cells, in which a memory capacitor is disposed above an FET, and in which a conductive plug provides electrical contact between the FET and the bottom electrode of the memory capacitor, iridium oxide can serve as both an electrode and an oxidation barrier to protect the conductive plug against oxidation.

A ferroelectric layer 112 is disposed above bottom electrode 110. Ferroelectric layer 112 is a thin film of bismuth-containing layered superlattice material having a high dielectric constant and ferroelectric properties. Ferroelectric layer 112 is fabricated as described in detail below and typically has a thickness less than 200 nm, preferably in a range of from 30 nm to 150 nm, and most preferably in a range of from 50 nm to 100 nm thick. Ferroelectric layer 112 is most preferably a bismuth-containing mixed layered superlattice material.

Many layered superlattice materials have a plurality of perovskite-like oxygen octahedron layers separated by a corresponding number of bismuth oxide layers. Layered superlattice materials are typically ferroelectric materials, though not all such materials may exhibit ferroelectric behavior at room temperature. These materials normally have high dielectric constants, and are useful in high dielectric constant capacitors, whether or not they are ferroelectric. Therefore, a bismuth tantalate capping layer in accordance with the invention is also useful in combination with a nonferroelectric, high-dielectric constant thin film of layered superlattice material to increase dielectric breakdown voltage. Similarly, a method in accordance with the invention is also useful for forming a dielectric device containing a thin film of nonferroelectric layered superlattice material having a bismuth tantalate capping layer.

The term "ramping rate" applies to the rate of temperature increase applied to an integrated circuit substrate during a rapid thermal processing (RTP) step. The term typically designates the control setting of an RTP apparatus, rather than the actual ramping rate of the temperature. For example, for a ramping rate control-setting of 100° C. per second in the examples below, the actual ramping rate was probably about 60° C. per second.

Terms such as "heating", "drying", "baking", "rapid thermal process" ("RTP"), "furnace anneal", and others all involve the application of heat. For the sake of clarity, the various terms are used in the art to distinguish certain techniques and method steps from one another. It is clear that similar techniques may be used to accomplish differently named process steps; for example, drying, baking and furnace annealing may typically be accomplished using the same apparatus, the only differences being their function and position in a fabrication sequence, or the particular temperatures used. As a result, it would be possible to designate an annealing step as a heating step, or a drying step as a baking step. To avoid confusion, therefore, the general terms "heating" and "heat treating" may also be used to describe a fabrication step. A rapid thermal processing (RTP) technique in accordance with the invention is distinct from other heating techniques in being characterized by a very rapid rise in temperature, typically at an actual ramping rate of 10° C. to 100° C. per second. It is further understood that one skilled in the art may accomplish a desired process result using heat as disclosed herein, while referring to the process with a term different from the one used herein.

The layered superlattice materials may be described generally using the formula:

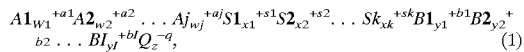

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-q}, \quad (1)$$

where A1, A2 . . . Aj represent A-site elements in a perovskite-like structure, which may be elements such as strontium, calcium, barium, bismuth, lead, and others; S1, S2 . . . Sk represent superlattice generator elements, which usually is only bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in Formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary uniformly throughout the material; for example, in $SrBi_2(Ta_{0.75}Nb_{0.25})_2O_9$, 75% of the B-sites are occupied by tantalum atoms, and 25% of the B-sites are occupied by niobium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form since the invention is intended to include cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz. \quad (2)$$

Formula (1) includes all three of the Smolenskii type compounds discussed in U.S. Pat. No. 5,519,234 issued May 21, 1996 to Paz de Araujo et al., which is hereby incorporated by reference as if fully contained herein. The layered superlattice materials do not include every material that can be fit into Formula (1), but only those which spontaneously form themselves into crystalline structures with distinct alternating layers.

U.S. Pat. No. 5,803,961, issued Sep. 8, 1998, to Azuma et al., which is hereby incorporated herein by reference as though fully disclosed herein, discloses that mixed layered superlattice materials, such as strontium bismuth tantalum niobate, can have even more improved properties in ferroelectric applications. The mixed layered superlattice materials are characterized by nonstoichiometric amounts of A-site and B-site elements. For example, a preferred precursor used in accordance with the invention comprises metal organic precursor compounds having metals in relative molar proportions corresponding to the stoichiometrically unbalanced formula $Sr_{0.8}Bi_2(Ta_{0.7}Nb_{0.3})_2O_{8.8}$.

Currently, ferroelectric layered superlattice materials, like the metal oxides $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.8 \leq a \leq 1.2 \leq b \leq 2.2$, $0 \leq x \leq 0.3$ and $1.9 \leq c \leq 2.1$ (SBTN), are being used and are under further development for use as a capacitor dielectric in nonvolatile ferroelectric memory applications, such as in FeRAMs and nondestructible read-out ferroelectric FETs. Polycrystalline thin films of these layered superlattice materials, as well as other bismuth-containing layered superlattice materials represented by Formula (1), may be fabricated and used in accordance with the invention.

The layered superlattice materials by definition do not include every collection of ingredients that can be fit into Formula (1), but only those materials that spontaneously form themselves into distinct crystalline layers of a superlattice during crystallization. This spontaneous crystallization is typically assisted by thermally treating or annealing the mixture of ingredients. The enhanced temperature facilitates ordering of the superlattice-forming atoms into thermodynamically favored structures, such as perovskite-like octahedrons.

Bismuth has an ionic radius that permits it to function as either an A-site material or a superlattice generator; but bismuth, if present in amounts less than a threshold stoichiometric proportion, will spontaneously concentrate as a non-perovskite-like bismuth oxide layer.

The term "layered superlattice material" herein also includes doped layered superlattice materials. That is, any of the material included in Formula (1) may be doped with a variety of materials, such as silicon, germanium, uranium, zirconium, tin, chromium, dysprosium, or hafnium.

It was previously known in the art to use a bismuth oxide capping layer on a ferroelectric thin film comprising strontium bismuth tantalate (SBT) layered superlattice material. The prior art did not teach or disclose a capping layer capable of increasing the dielectric breakdown voltage of a thin film of layered superlattice material. Indeed, as reported below in the examples, a capacitor having an SBT thin film and a bismuth oxide capping layer has a low dielectric breakdown voltage, making such a capacitor generally unsuitable for use in an integrated circuit memory.

A top electrode 116 is typically about 100 nm to 200 nm thick, and is usually made of the same metal or electrode structure as the bottom electrode 110, except titanium or other adhesion metal is normally not needed. Top electrode 116 may also have a different structure or be made of a different metal than bottom electrode 110.

As is known in the art, ferroelectric device 100 may include other conventional layers, such as diffusion barrier layers. Many other materials may be used for any of the layers discussed above, such as silicon nitride for insulating layer 108; gallium arsenide, indium antimonide, magnesium oxide, strontium titanate, sapphire or quartz for wafer 106; and many other adhesion layers, barrier layers, and electrode materials. Bottom electrode 110 may be eliminated, in which case ferroelectric device 100 is no longer a ferroelectric capacitor, and becomes useful as a 1T or transistor gate in what is known as a metal-ferroelectric-insulator-semiconductor cell. Further, it should be understood that FIG. 1 is not meant to be an actual cross-sectional view of any particular portion of an actual electronic device, but is merely an idealized representation which is employed to more clearly and fully depict the structure and process of the invention than would otherwise be possible. For example, the relative thicknesses of the individual layers are not depicted proportionately, since otherwise some layers, such as the substrate 106, would be so thick as to make the drawing unwieldy.

Figure 2:
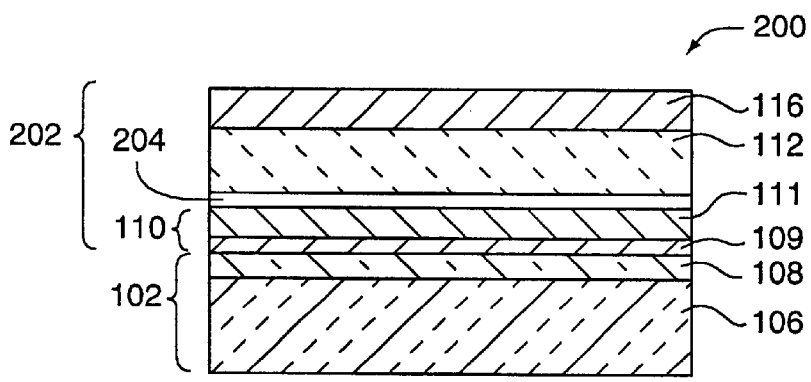
FIG. 2 depicts an integrated circuit device having a bismuth tantalate capping layer beneath a ferroelectric layer and above a bottom electrode.

FIG. 2 depicts a second ferroelectric device 200. In FIG. 2, like numbering of identical components has been retained with respect to FIG. 1. Ferroelectric device 200 contains a ferroelectric capacitor 202 that differs from ferroelectric capacitor 104 by the addition of a bismuth tantalate capping layer 204 interposed between ferroelectric layer 112 and bottom electrode 110. Upper capping layer 114 is absent in the FIG. 2 embodiment, but capping layer 114 could also be included in place between top electrode 116 and ferroelectric layer 112.

Figure 3:
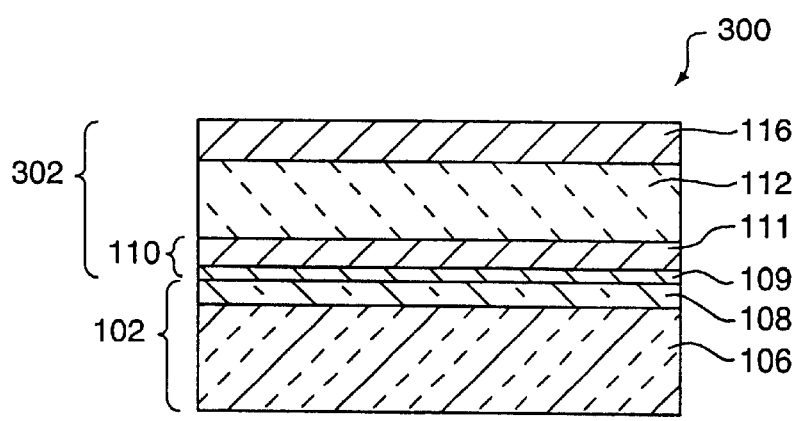
FIG. 3 depicts a comparative device having no capping layer.

FIG. 3 depicts a prior art ferroelectric device 300. In FIG. 3, like numbering of identical components has been retained with respect to FIG. 1. Ferroelectric device 300 contains a ferroelectric capacitor 302 that differs from ferroelectric capacitors 104 and 202 by having no capping layer 114 and no capping layer 204.

The components of devices 100, 200 and 300, except thin film 112 of layered superlattice material and capping layers 114 and 204, are made according to known methods. These conventional methods are well known in the art and include, for example, thermal oxidation of wafer 106 to yield insulating layer 108 or spin-on glass deposition of layer 108 with a substantially similar result. Conventional sputtering processes are used to deposit bottom electrodes 110 and top electrodes 116. Conventional resist etching techniques are used to pattern the devices for their inclusion in integrated circuits. These processes are not critical to the invention. For example, substrate 102 is alternatively a stacked integrated circuit structure resulting from conventional CMOS processes.

Layered superlattice material thin film 112 is deposited by sputtering, by chemical vapor deposition, by misted liquid deposition, by spin-on liquid deposition, or by any other suitable means of deposition. The capping layers 114 and 204 may be produced from sputtered metal that is oxidized in an anneal, the oxidized metal may itself be sputtered, or the layers may be produced from spin-on liquid precursors, such as sol-gels (metal alkoxides), metal carboxylates or metal alkoxycarboxylate solutions. Misted liquid deposition or chemical vapor deposition may also be used. In a method in accordance with the invention, deposited precursor coating layers for thin film 112 and capping layers 114, 204 are subjected to heat treating at elevated temperatures that do not exceed 700° C. to achieve desired crystallization of the metal oxide materials and to maximize the desired electronic characteristics. Heat treating in a post-anneal at a temperature not exceeding 700° C. is also typically conducted after formation of top electrode layer 116.

Figure 4:
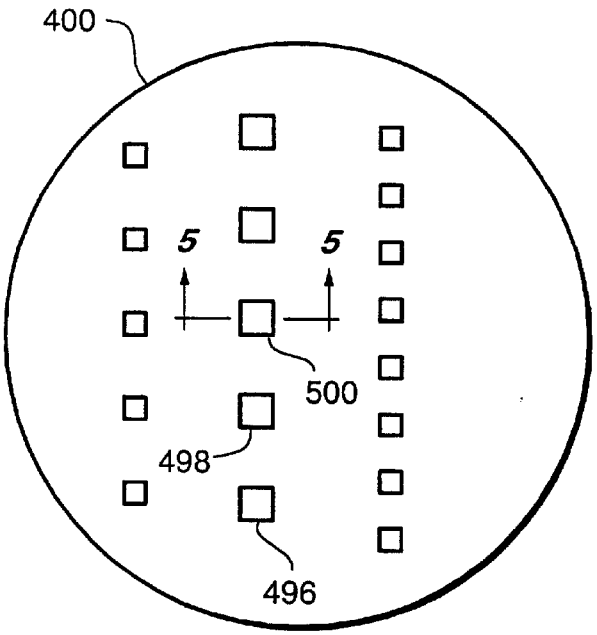
FIG. 4 is a top view of an exemplary wafer on which thin film capacitors fabricated in accordance with the invention are shown greatly enlarged.
Figure 5:
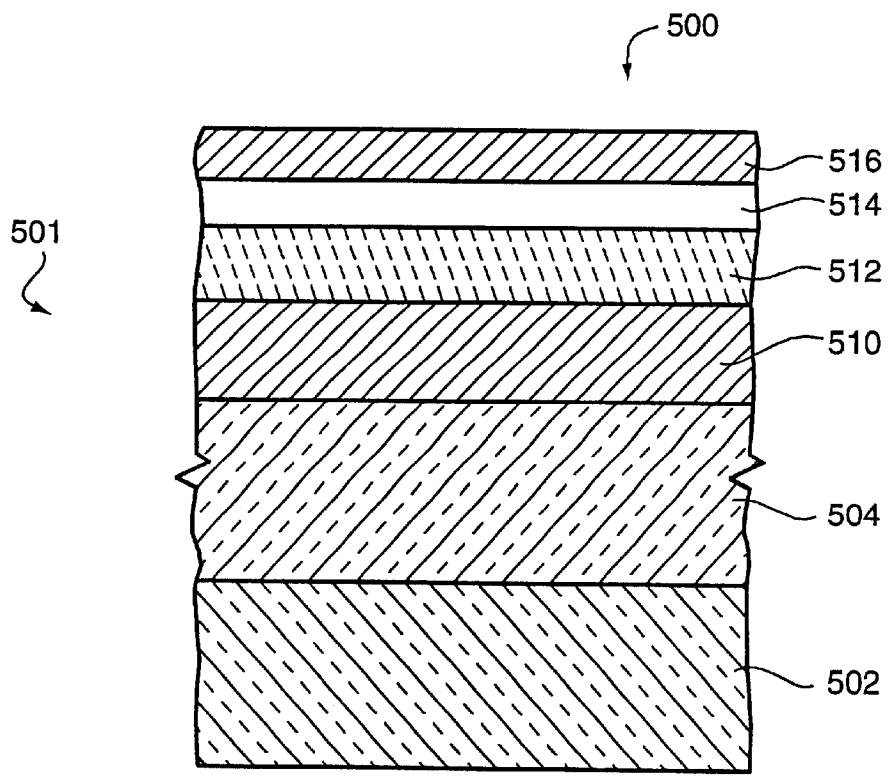
FIG. 5 is a portion of a cross-section of FIG. 4 taken through the lines 5—5, illustrating an exemplary thin film capacitor fabricated in accordance with the invention.

The non-limiting examples below set forth preferred methods and materials for practicing the invention. FIG. 4 is a top view of an exemplary wafer 400 on which thin film capacitors 496, 498 and 500 fabricated on substrate 402 in accordance with the invention are shown greatly enlarged. FIG. 5 is a portion of a cross-section 501 of FIG. 4 taken through the lines 5—5, illustrating thin film capacitor 500 fabricated in accordance with the invention. Section 501 includes a silicon dioxide layer 504 formed on a silicon crystal substrate 502. A bottom electrode 510 made of platinum is sputter-deposited on layer 504. Layer 512 represents a thin film of layered superlattice material made in accordance with the invention, layer 514 is the capping layer, and layer 516 represents a top electrode made of platinum.

EXAMPLE 1

Ferroelectric thin film capacitors, as depicted in FIGS. 4 and 5, containing a thin film 512 of strontium bismuth tantalate layered superlattice material were fabricated in accordance with the invention. Selected capacitors included bismuth tantalate capping layers 514 in accordance with the invention; other capacitors either did not have a capping layer or included a bismuth oxide capping layer for comparison. The remanent polarization, leakage current and dielectric breakdown voltage of the capacitors were measured and compared to study the effects of a bismuth tantalate capping layer on electronic properties.

Each of a series of P-type 100 Si wafer substrates 502 was prepared by conventional means to include a thermally grown layer of silicon dioxide 504. Platinum metal was sputtered to form a bottom electrode 510 having a thickness of about 200 nm. Then each substrate was annealed 30 minutes in $O_2$ at 650° C., and dehydrated 30 minutes at 180° C. in low vacuum.

A research grade purity solution of metal 2-ethylhexanoates in xylenes was purchased on commercial order from Kojundo Chemical Company of Japan for the deposition of ferroelectric layered superlattice material layer 512. The 0.2 M solution contained molar proportions of strontium, bismuth, and tantalum in ratio of 0.9:2.2:9.2. Thus, the solution contained metal atoms in relative proportions for forming strontium bismuth tantalate (SBT) having an empirical formula $Sr_{0.9}Bi_{2.2}Ta_2O_{9.2}$. A 3 milliliter (ml)

aliquot of the solution was mixed with 2 ml of n-butyl acetate cosolvent to provide a 0.12 M solution with improved substrate wetting capacity.

Each wafer substrate was placed in a conventional spin-coater machine. The substrate was spun at 1900 rpm for 30 seconds while 3 ml of solution were applied to the surface of the platinum bottom electrode layer by pipette. Each wafer was removed from the spin coating machine and placed on a hot plate in $O_2$ gas for one minute at 160° C., followed by four minutes at 260° C. This drying, dehydration and baking sequence served to eliminate solvent and organic ligands from the dried precursor coating. The precursor coating on each wafer was then annealed using rapid-thermal-processing (RTP) at 675° C. for 30 seconds in $O_2$ gas, with a ramping rate of 100° C. per second using a conventional halogen lamp RTP device. This resulted in an initial dried coating having a thickness of about 40 nm. The steps of precursor deposition through rapid thermal processing anneal were conducted a second time to build the total thickness of the thin film 514 up to about 80 nm.

Research grade purity solutions of bismuth 2-ethylhexanoate and tantalum 2-ethylhexanoate in xylenes having 0.4 M concentration were purchased on commercial order from Kojundo Chemical Company of Japan. Aliquots of the two solutions were combined to form precursor solutions for bismuth tantalate capping layers in accordance with the invention. One solution contained bismuth and tantalum in relative proportions corresponding to a stoichiometrically balanced formula $BiTaO_4$. A second solution contained 7.5% excess bismuth relative to the stoichiometrically balanced amount, corresponding to an empirical formula $Bi_{1.075}TaO_4$. A third solution contained a deficient amount of tantalum relative to the stoichiometrically balanced amount, corresponding to the empirical formula $Bi_{0.925}TaO_4$. A one ml aliquot of these solutions was mixed with 1.6 ml of n-butyl acetate to yield 0.154 M precursor solutions. Similarly, a 0.154 M solution of bismuth 2-ethylhexanoate was prepared for forming a bismuth oxide capping layer.

Each of selected wafers was placed into a conventional spin-coating machine and spun at 1500 rpm for 30 seconds while a precursor solution for a particular capping layer composition was applied by pipette. Each wafer substrate was removed from the spin coating machine and placed on a hot plate in $O_2$ gas for 1 minute at 150° C. for drying of the precursor film by the elimination of solvent. The substrate was next placed on a hot plate at 260° C. for 4 minutes to eliminate additional solvent and organic ligands from the precursor film. The thickness of the capping layers 514 was about 20 nm. One of the wafers was not coated with a capping layer.

Finally, the wafers and deposited coatings were annealed for 60 minutes at 700° C. in $O_2$ gas. These steps formed a ferroelectric thin film 512 of strontium bismuth tantalate layered superlattice material having a thickness of about 80 nm and capping layers 514 having a thickness of 20 nm.

Platinum was sputter-deposited into place using a DC magnetron to make a top electrode layer 516 with a thickness of about 200 nm. The platinum, capping layer and strontium bismuth tantalate layers were milled to form the capacitors, and then ashing was performed, followed by a post-anneal for 30 minutes at 700° C. in a diffusion furnace under positive $O_2$ gas flow. The capacitors had a surface area of 6940 $\mu m^2$. Representative capacitors were selected for test measurements.

Figure 6:
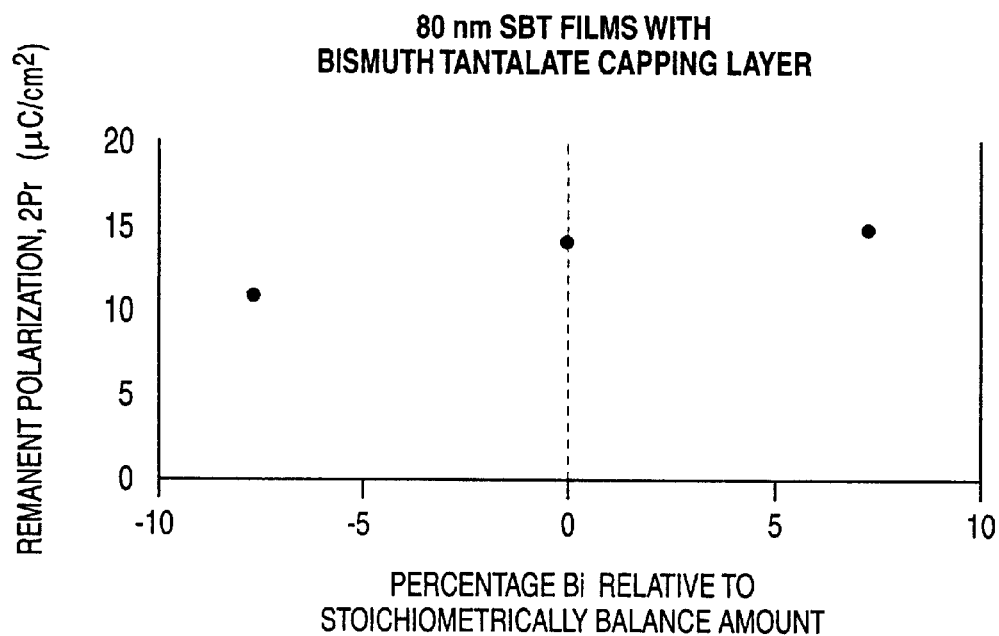
FIG. 6 shows a graph in which the remanent polarization, expressed as the 2Pr-value in units of $\mu C/cm^2$, is plotted as a function of bismuth concentration in bismuth tantalate capping layers.

FIG. 6 shows a graph in which the remanent polarization, expressed as the 2Pr-value in units of $\mu C/cm^2$, is plotted as a function of bismuth concentration in bismuth tantalate capping layers. The bismuth concentration in FIG. 6 is expressed as a percentage of a stoichiometrically balanced amount. The data point at 0.0% (i.e., the stoichiometrically balanced amount of bismuth) and at 7.5% excess bismuth indicate that the ferroelectric capacitors having bismuth tantalate capping layers corresponding to those concentrations have 2Pr-values of about 15 $\mu C/cm^2$. The third data point in the graph of FIG. 6 at −7.5% indicates a decrease in the ferroelectric polarizability of the capacitor when the bismuth concentration is reduced compared to the stoichiometrically balanced amount.

Figure 7:
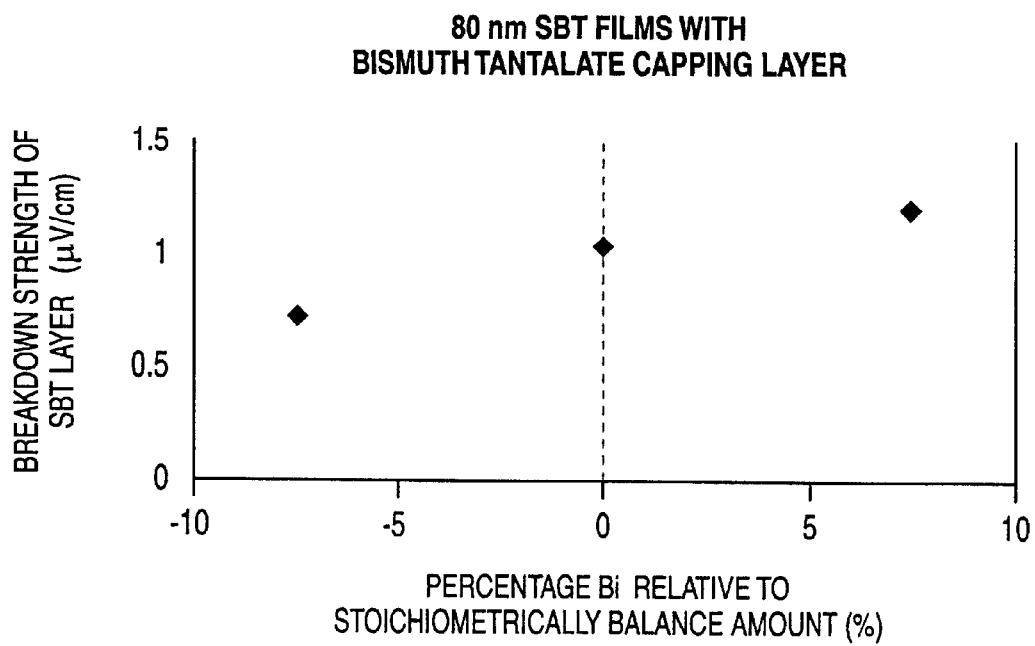
FIG. 7 shows a graph in which the dielectric breakdown strength of ferroelectric capacitors, in units of megavolts per cm (MV/cm), is plotted as a function of percentage bismuth-concentration.

In a graph of FIG. 7, the dielectric breakdown strength of the ferroelectric capacitors, in units of megavolts per cm (MV/cm) was plotted as a function of percentage bismuth-concentration. The data point at 7.5% excess bismuth having a value of approximately 1.3 MV/cm shows an increase in dielectric breakdown strength compared to a ferroelectric capacitor made from a stoichiometrically balanced precursor. A ferroelectric capacitor having a capping layer made from a precursor containing 7.5% deficiency of bismuth has a dielectric breakdown strength of about 0.75 MV/cm. It is believed that the desirable effect of an increase in dielectric breakdown strength can be enhanced by increasing the relative amount of excess bismuth up to 25%.

Figure 8:
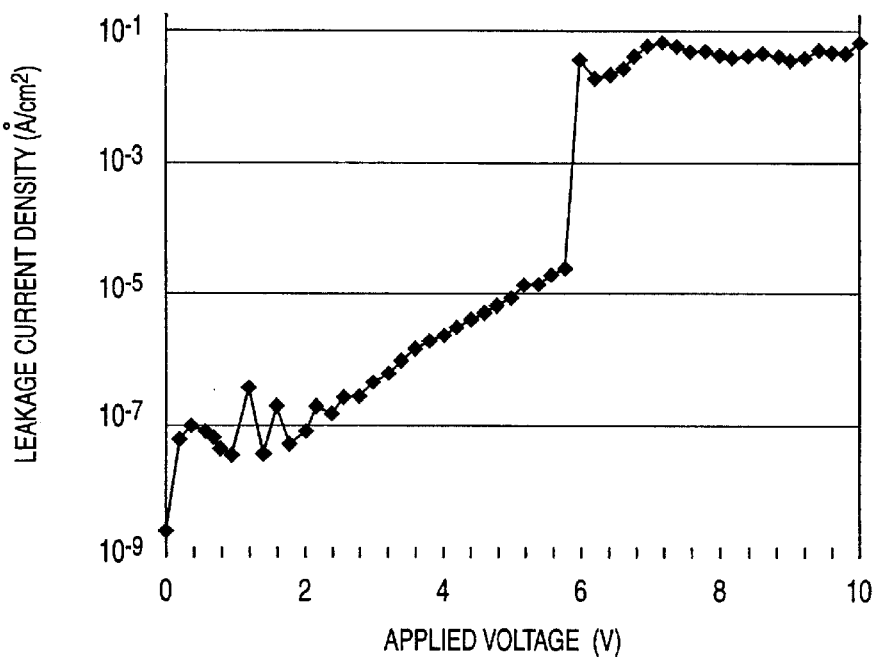
FIG. 8 shows a graph in which current density, in units of $A/cm^2$, is plotted as a function of applied voltage for a capacitor having an SBT thin film of 80 nm thickness without a capping layer.
Figure 9:
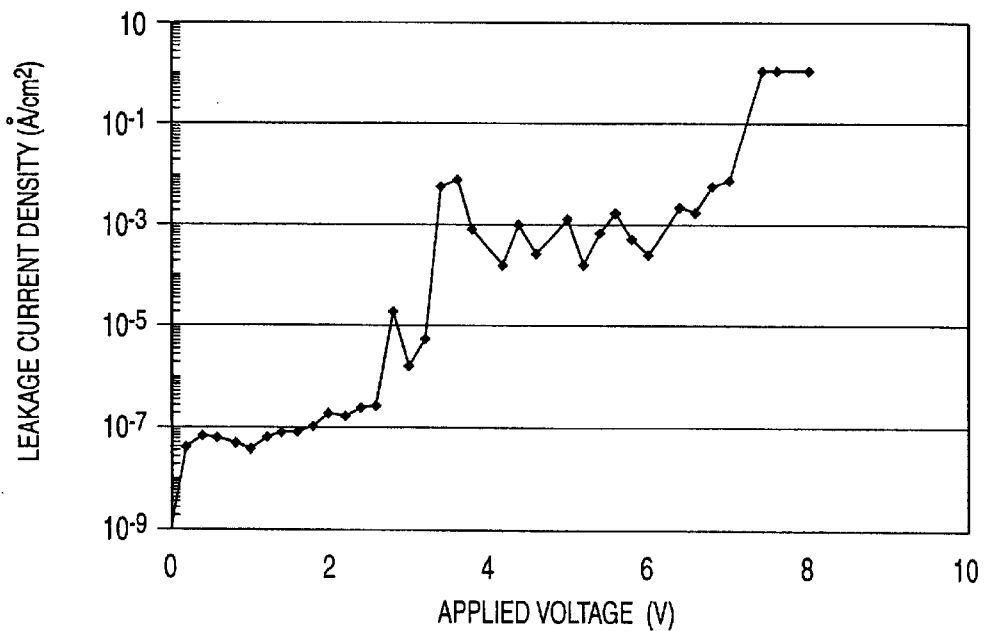
FIG. 9 shows a graph in which current density is plotted as a function of applied voltage in a capacitor in which a bismuth oxide capping layer having a thickness of about 20 nm covers the top surface of an SBT thin film of 80 nm thickness.
Figure 10:
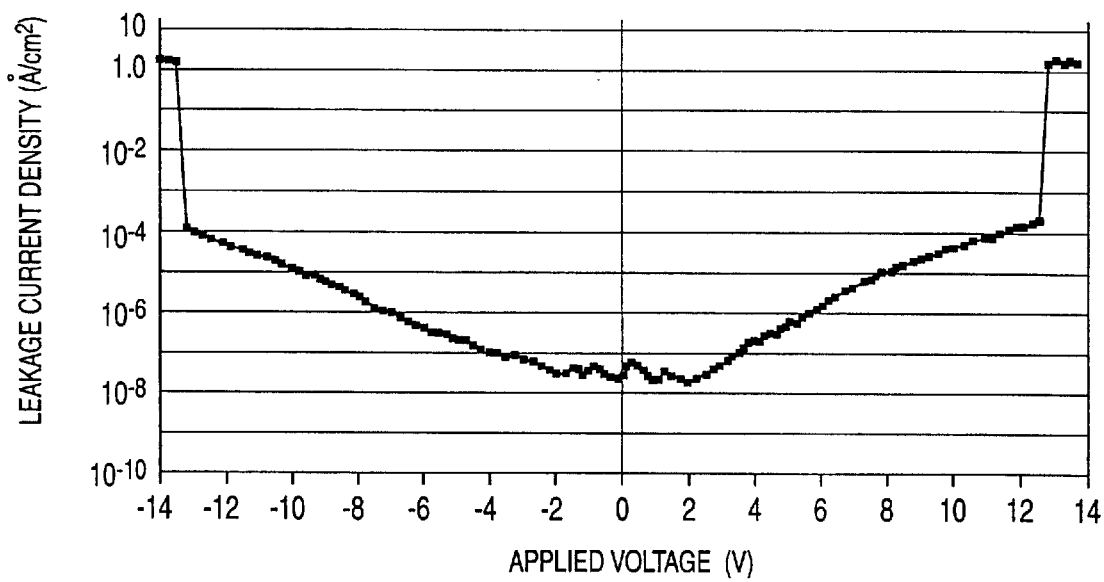
FIG. 10 shows a graph in which current density is plotted as a function of applied voltage in a capacitor having a bismuth tantalate capping layer and a thin film of bismuth-containing layered superlattice material fabricated in accordance with the invention.

In the graphs of FIGS. 8, 9 and 10, leakage current density, in units of $A/cm^2$, is plotted as a function of applied voltage, in units of volts. The graph of FIG. 8 shows the current density measured in a capacitor having an SBT thin film of 80 nm thickness without a capping layer. The plotted data show that the current density does not exceed $10^{-6}$ $A/cm^2$ at 3 volts, but the current density rises to an undesirably high value of about $10^{-5}$ $A/cm^2$ at an applied voltage of about 5 volts. Furthermore, dielectric breakdown of the capacitor occurred at an applied voltage of about 6 volts. A dielectric breakdown voltage of only 6 volts is generally unacceptable because the dielectric breakdown voltage of an integrated circuit memory capacitor should be about four times greater than its normal operating voltage.

The graph of FIG. 9 shows the current density measured in a capacitor in which a bismuth oxide capping layer having a thickness of about 20 nm covers the top surface of an SBT thin film of 80 nm thickness. The plotted data show that the current density was at an acceptable level up to about 3 volts, but that it jumped several orders of magnitude to unacceptable levels of about $10^{-3}$ $A/cm^2$ above 3 volts. Furthermore, dielectric breakdown of the capacitor occurred conclusively at an applied voltage of about 7 volts, and the leakage current was unacceptably high in the applied voltage range of 3 volts to 7 volts.

The graph of FIG. 10 shows the current density measured in a capacitor having a capping layer and a thin film of bismuth-containing layered superlattice material fabricated in accordance with the invention. A bismuth tantalate capping layer containing 7.5% excess bismuth having a thickness of about 20 nm covered the top surface of an SBT thin film of 80 nm thickness. The plotted data show that the current density was below the desired maximum level of $10^{-6}$ $A/cm^2$ up to an applied voltage of 5 volts. More importantly, dielectric breakdown did not occur until about 13 volts. Since the typical operating voltage of currently designed integrated circuit memories is about 3 volts, the dielectric breakdown voltage exceeded the desired minimum value of four times the normal operating voltage. Thus, the exemplary memory capacitor in accordance with the invention, having a thin film of ferroelectric layered superlattice material covered with a bismuth tantalate capping layer, had a dielectric breakdown voltage suitably high for utilization in integrated circuits. The data plotted in the graphs of FIGS. 6 and 10 indicate that a ferroelectric device in accordance with the invention having a thin film of layered superlattice material with a thickness not exceeding 100 nm and covered with a bismuth tantalate capping layer is suitable for use as a nonvolatile memory in integrated circuits. Although it was previously known in the art to make a thin film of layered superlaftice material having a thickness not exceeding 100 nm and also having good ferroelectric polarizability, it was not known previous to this invention to have a thin film of layered superlattice material having a thickness not exceeding 100 nm and also having a relatively high dielectric breakdown voltage of 13 volts. The high dielectric breakdown voltage of the capacitor represented in FIG. 10 was especially unexpected in view of the low dielectric breakdown voltage in the capacitor of FIG. 9. The SBT thin film of FIG. 9 was covered with a bismuth oxide capping layer, and the only difference between the capacitors of FIG. 9 and FIG. 10 was that the capacitor of FIG. 10 was covered with a capping layer comprising bismuth tantalate instead of bismuth oxide. There was no reason to expect that the presence of bismuth tantalate in place of bismuth oxide in the capping layer would have such a desirable effect, thereby making the thin film of layered superlattice material suitable for use in an integrated circuit device having an operating voltage of 3 volts.

EXAMPLE 2

Exemplary capacitors were fabricated in accordance with the invention using a variation of the method used in Example 1, except the one-hour furnace anneal at 700° C. was performed after the RTP anneal of the second spin-coat layer, before deposition of the bismuth tantalate capping layer. Also, the bismuth tantalate capping layer was not given a furnace anneal after the RTP anneal of the capping layer. Measurement of the electronic properties of the capacitors indicated that the electronic properties were essentially the same as those in the capacitors of Example 1.

There has been described an integrated circuit device containing a thin film of bismuth-containing layered superlattice material, preferably with a thickness not exceeding 100 nm, and a bismuth tantalate capping layer covering at least one of the top and bottom surfaces of the layered superlattice material thin film. A layered superlattice material thin film having a bismuth tantalate capping layer increases integrated circuit density and possesses superior electronic properties, in particular, a higher dielectric breakdown voltage than known in the prior art. A device in accordance with the invention is particularly useful in ferroelectric integrated circuit devices in which the thin film of layered superlattice material comprises bismuth-containing ferroelectric layered superlattice material, such as strontium bismuth tantalate and strontium bismuth tantalum niobate. It is understood, however, that the capping layer of bismuth tantalate in accordance with the invention is useful in integrated circuits in which bismuth-containing nonferroelectric layered superlaftice materials are used for their high-dielectric properties. There has also been described a low-temperature method for fabricating the bismuth-containing layered superlattice material thin film and the bismuth tantalate capping layer of the invention. In contrast to the teaching of the prior art, the process heating temperature in the inventive method does not exceed 700° C., and the total heating time of the dielectric and bismuth tantalate capping layers does not exceed two hours. This low temperature process has been found to be particularly effective for obtaining high yields of extremely thin films in commercial fabrication settings. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. For example, now that a ferroelectric memory has been disclosed containing a bismuth tantalate capping layer and a ferroelectric thin film of bismuth-containing layered superlattice material with a thickness not exceeding 100 nm, good polarizability and high dielectric breakdown voltage, a structure in accordance with the invention can be combined with other structures to provide variations on the device described. Similarly, now that a low-temperature method for fabricating capping layers and thin films of layered superlattice materials has been disclosed as a viable part of the process for fabricating extremely dense ferroelectric memory devices, variations on the method described may be made. It is also evident that the steps recited may in some instances be performed in a different order; or equivalent structures and processes may be substituted for the various structures and processes described. Consequently, the invention is to be construed as embracing each and every novel feature and novel combination of features present in and/or possessed by the fabrication processes, electronic devices, and electronic device manufacturing methods described.

What is claimed is:

1. An integrated circuit device comprising:
   a substrate;
   a thin film of bismuth-containing layered superlattice material supported on said substrate and having a thickness less than 100 nm;
   an electrode; and
   a capping layer comprising the chemical compound bismuth tantalate and having a thickness in a range of from 3 nm to 30 nm, said capping layer interposed between said thin film and said electrode.

2. An integrated circuit device as in claim 1, characterized in that said capping layer includes an excess amount of bismuth relative to the stoichiometrically balanced amount represented by the balanced stoichiometric formula $BiTaO_4$.

3. An integrated circuit device as in claim 2, characterized in that said excess amount of bismuth is in a range of from 1% to 25% of a stoichiometrically balanced amount.

4. An integrated circuit device as in claim 3, characterized in that said excess amount of bismuth is in a range of from 5% to 15%.

5. An integrated circuit device as in claim 4, characterized in that said excess amount of bismuth is 7.5%.

6. An integrated circuit device as in claim 1, characterized in that said bismuth-containing layered superlattice material is selected from the group consisting of strontium bismuth tantalate, strontium bismuth niobate, and strontium bismuth niobium tantalate.

7. An integrated circuit device as in claim 1, characterized in that said bismuth-containing layered superlattice material is ferroelectric.

8. An integrated circuit device as in claim 1, characterized in that said bismuth-containing layered superlattice material is nonferroelectric.

9. An integrated circuit device as in claim 1, characterized in that said capping layer is in direct contact with said thin film of bismuth-containing layered superlattice material and said electrode.

10. An integrated circuit device as in claim 1, characterized in that said capping layer has a thickness ranging from 5 nm to 20 nm.

11. An integrated circuit device as in claim 1, characterized in that said electrode comprises a material selected from the group consisting of platinum, iridium oxide, aluminum, gold, ruthenium, rhodium, and palladium.

12. An integrated circuit device as in claim 7, characterized in that said electrode is a top electrode, said top electrode being remote from said substrate relative to said ferroelectric layer.

13. An integrated circuit device as in claim 1, characterized by a bottom electrode interposed between said bismuth-containing layered superlattice material and said substrate.

14. An integrated circuit device comprising:
   a substrate;
   a thin film of bismuth-containing layered superlattice material supported on said substrate;
   an electrode; and
   a capping layer comprising the chemical compound bismuth tantalate, said capping layer interposed between said thin film and said electrode, said capping layer including an excess amount of bismuth relative to the stoichiometrically balanced amount represented by the balanced stoichiometric formula $BiTaO_4$.

15. An integrated circuit device as in claim 14, characterized in that said excess amount of bismuth is in a range of from 1% to 25% of a stoichiometrically balanced amount.

16. An integrated circuit device as in claim 15, characterized in that said excess amount of bismuth is in a range of from 5% to 15%.

17. An integrated circuit device as in claim 16, characterized in that said excess amount of bismuth is 7.5%.

18. An integrated circuit device as in claim 14 wherein said layered superlattice material has a thickness less than 100 nm.

* * * * *